United States Patent
Kim

(10) Patent No.: US 7,598,554 B2
(45) Date of Patent: Oct. 6, 2009

(54) CMOS IMAGE SENSOR AND METHOD FOR FABRICATING THE SAME

(75) Inventor: In Su Kim, Choongcheongbukdo (KR)

(73) Assignee: DongbuAnam Semiconductor Inc., Seoul (KR)

( * ) Notice: Subject to any disclaimer, the term of this patent is extended or adjusted under 35 U.S.C. 154(b) by 211 days.

(21) Appl. No.: 11/583,037

(22) Filed: Oct. 19, 2006

(65) Prior Publication Data

US 2007/0034982 A1 Feb. 15, 2007

Related U.S. Application Data

(62) Division of application No. 11/022,827, filed on Dec. 28, 2004, now Pat. No. 7,253,018.

(30) Foreign Application Priority Data

Jul. 15, 2004 (KR) .................. 10-2004-0055106

(51) Int. Cl.
 *H01L 31/062* (2006.01)
(52) U.S. Cl. .................. 257/294; 257/432; 257/443; 257/E27.133; 257/E31.127
(58) Field of Classification Search ......... 257/292, 257/294, 432, 443, E27.133, E31.127
See application file for complete search history.

(56) References Cited

U.S. PATENT DOCUMENTS

| | | | | |
|---|---|---|---|---|
| 5,321,297 A | * | 6/1994 | Enomoto | 257/432 |
| 5,384,231 A | * | 1/1995 | Johnson et al. | 430/321 |
| 5,900,655 A | * | 5/1999 | Shim | 257/232 |
| 6,171,883 B1 | * | 1/2001 | Fan et al. | 438/65 |
| 6,221,687 B1 | * | 4/2001 | Abramovich | 438/70 |
| 6,362,498 B2 | | 3/2002 | Abramovich | |
| 6,940,654 B1 | | 9/2005 | Tang | |
| 7,078,260 B2 | * | 7/2006 | Jeon | 438/65 |
| 7,262,072 B2 | * | 8/2007 | Kim | 438/57 |
| 7,393,477 B2 | * | 7/2008 | Liao | 264/1.32 |

FOREIGN PATENT DOCUMENTS

| | | |
|---|---|---|
| JP | 05-335533 | 12/1993 |
| JP | 09-090104 | 4/1997 |
| JP | 2003-204050 | 7/2003 |
| KR | 2003-0061341 | 7/2001 |
| KR | 2003-0057676 | 7/2003 |

OTHER PUBLICATIONS

Office Action from the Korean Intellectual Property Office, dated Feb. 14, 2006, in counterpart Korean Patent Application No. 2004-0055106.

Office Action from the Japanese Intellectual Property Office, dated Jun. 19, 2006, in counterpart Japanese Patent Application No. 2004-376939.

* cited by examiner

*Primary Examiner*—M. Wilczewski
*Assistant Examiner*—Toniae M Thomas
(74) *Attorney, Agent, or Firm*—Finnegan, Henderson, Farabow, Garrett, & Dunner, L.L.P.

(57) ABSTRACT

A complementary metal-oxide semiconductor (CMOS) image sensor and a method for fabricating the same are disclosed. The image sensor includes a sub-layer having a photodiode and a plurality of transistors formed thereon, a pad insulating layer formed on the sub-layer, a micro-lens formed on the pad insulating layer, the micro-lens including a first insulating layer having an uneven surface and a second insulating layer covering upper and side surfaces of a projected portion of the first insulating layer to form a dome shape, and a planarization layer formed on the micro-lens, and a color filter formed on the planarization layer.

3 Claims, 6 Drawing Sheets

CMOS IMAGE SENSOR AND METHOD FOR FABRICATING THE SAME

This application is a divisional Application of application Ser. No. 11/022,827, filed Dec. 28, 2004, now U.S. Pat. No. 7,253,018 which was based upon and claims the benefit of priority of the Korean Patent Application No. 10-2004-0055106, filed on Jul. 15, 2004. The entire contents of these applications are hereby incorporated by reference in their entirety.

BACKGROUND OF THE INVENTION

1. Field of the Invention

The present invention relates to an image sensor, and more particularly, to a complementary metal-oxide semiconductor (CMOS) image sensor and a method for fabricating the same. Although the present invention is suitable for a wide scope of applications, it is particularly suitable for enhancing a degree of integration of the device.

2. Discussion of the Related Art

Generally, an image sensor is a semiconductor device, which converts an optic image to an electric signal. More specifically, a charge coupled device (CCD) is a device having a plurality of metal-oxide-metal (MOS) capacitors each formed within a proximate range from one another, and wherein a carrier electric charge is stored in and transmitted to each capacitor. A complementary MOS (CMOS) image sensor is a device forming a number of MOS transistors corresponding to the number of pixels by using the CMOS technology, which uses a control circuit and a signal processing circuit as peripheral circuits, and adopting a switching method, which uses the MOS transistors to sequentially detect each output.

However, the CCD is disadvantageous in that the driving method is complicated and consumes a large amount of power, and the fabrication process is complicated having too many mask process steps. Furthermore, a one-chip circuit cannot be easily formed because the signal processing circuit cannot be realized in the CCD chip. Recently, in order to overcome such disadvantages, a CMOS image sensor using sub-micron CMOS fabrication technology has been under development. Various types of pixels are used in the CMOS image sensor. However, a 3-transistor (3-T) pixel and a 4-transistor (4-T) pixel are most widely used. The 3-T pixel consists of three main transistors and one photodiode, and the 4-T pixel consists of four main transistors and one photodiode.

FIG. 1 illustrates a circuit diagram of a unit pixel of a general 4-transistor (4-T) CMOS image sensor. Referring to FIG. 1, the unit pixel of a 4-T CMOS image sensor includes a photodiode (PD), which is a photosensitive device, and four transistors (Tx, Rx, Dx, and Sx). Herein, a transfer transistor (Tx) transfers electric charge generated from the photodiode (PD) to a floating sensing node (FSN). A reset transistor (Rx) discharges the electric charge stored in the floating sensing node (FSN) for signal detection. A drive transistor (Dx) acts as a source follower, and a select transistor (Sx) is used for switching and addressing. Also, a DC gate is a supplementary transistor always applying a uniform voltage as a gate potential of the transistor, thereby allowing a uniform electric current to flow through the transistor. $V_{DD}$ represents a driving voltage, $V_{SS}$ represents a ground voltage, and output is an output voltage of the unit pixel.

Hereinafter, a related art method for fabricating a CMOS image sensor will now be described. FIGS. 2A and 2B illustrates cross-sectional views of a related art method for fabricating a CMOS image sensor.

Referring to FIG. 2A, a pad insulating layer 11 is formed on a sub-layer 10 having the photodiode and the transistors formed thereon, so as to form the unit pixel of the CMOS image sensor. Then, although not shown in the drawings, the pad insulating layer 11 is selectively removed, so as to expose a metal line within the sub-layer 10. The metal line is used for connecting the transistors to an external device.

Thereafter, a dyed photoresist is deposited and treated with light-exposing and developing processes, so as to form a color filter layer 12. Subsequently, a micro-lens planarization layer 13 is formed, so as to form a uniform micro-lens. Then, a photoresist (PR) is deposited on the micro-lens planarization layer 13, which is then treated with light-exposing and developing processes, thereby patterning the photoresist (PR).

Referring to FIG. 2B, the patterned photoresist (PR) is treated with a heat treatment to carry out a reflow process on the photoresist, thereby forming a dome-shaped micro-lens 14. Thus, the fabrication of the related art CMOS image sensor is completed.

However, the related art CMOS image sensor has the following disadvantages. The photoresist is treated with a reflow process to from the micro-lens. However, the reflow process is difficult to control, thereby causing problems in fabricating the micro-lens in a dome shape. Furthermore, as the device becomes more integrated, the radius of the curvature of the micro-lens should also be reduced, which requires the thickness of the photoresist to become thinner. However, the photoresist cannot be formed thinner than a predetermined thickness. Thus, there are limitations in reducing the radius of the curvature of the micro-lens, thereby causing difficulty in the integration of the device.

SUMMARY OF THE INVENTION

Accordingly, the present invention is directed to a complementary metal-oxide semiconductor (CMOS) image sensor and a method for fabricating the same that substantially obviate one or more problems due to limitations and disadvantages of the related art.

An object of the present invention is to provide a complementary metal-oxide semiconductor (CMOS) image sensor and a method for fabricating the same, which can reduce a radius of a curvature of a micro-lens, thereby enhancing integration of the device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a complementary metal-oxide semiconductor (CMOS) image sensor includes a sub-layer having a photodiode and a plurality of transistors formed thereon, a pad insulating layer-formed on the sub-layer, a micro-lens formed on the pad insulating layer, the micro-lens including a first insulating layer having an uneven surface and a second insulating layer covering upper and side surfaces of a projected portion of the first insulating layer to form a dome shape, and a planarization layer formed on the micro-lens, and a color filter formed on the planarization layer.

In another aspect of the present invention, a method for fabricating a complementary metal-oxide semiconductor image sensor includes the steps of forming a pad insulating layer formed on a sub-layer having a photodiode and a plurality of transistors formed thereon, forming a first insulating layer having an uneven surface on the pad insulating layer, depositing a second insulating layer on the first insulating layer by using a high deposition plasma process, additionally depositing the second insulating layer, so as to form a dome-shaped portion over a projected portion of an uneven surface of the first insulating, and etching-back the second insulating layer so that the second insulating layer covers upper and side surfaces of the projected portion of the first insulating layer to form the dome-shaped portion, thereby forming a micro-lens including the projected portion of the first insulating layer and the dome-shaped portion of the second insulating layer covering the projected portion of the first insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
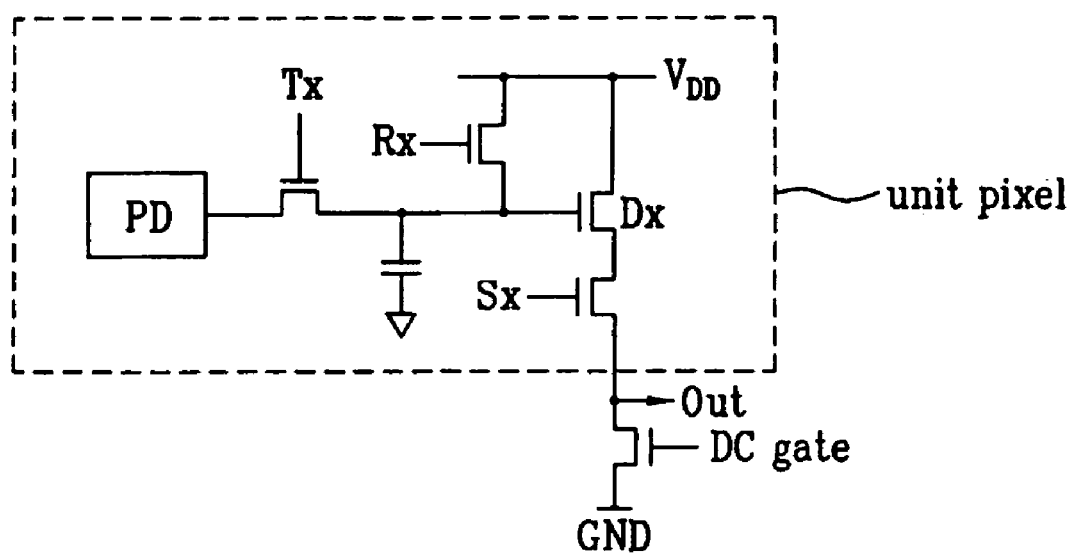
FIG. 1 illustrates a circuit diagram of a unit pixel of a general 4-transistor (4-T) CMOS image sensor.
Figure 2A:
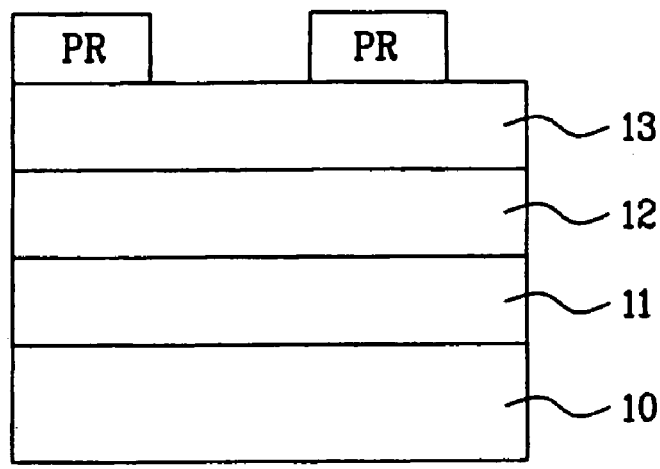
FIGS. 2A and 2B illustrate cross-sectional views of a related art method for fabricating a CMOS image sensor.
Figure 2B:
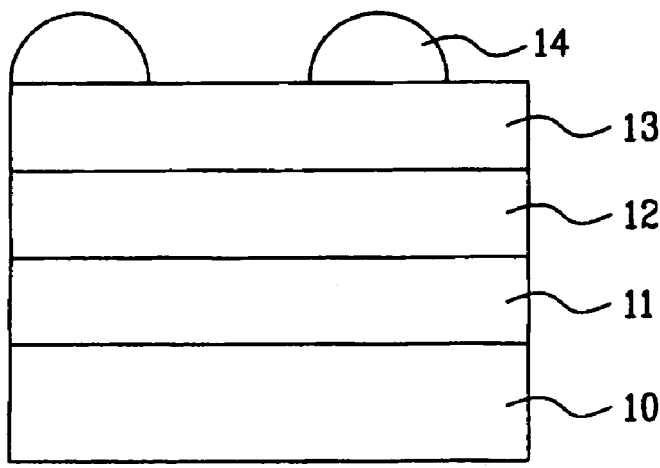
Figure 3:
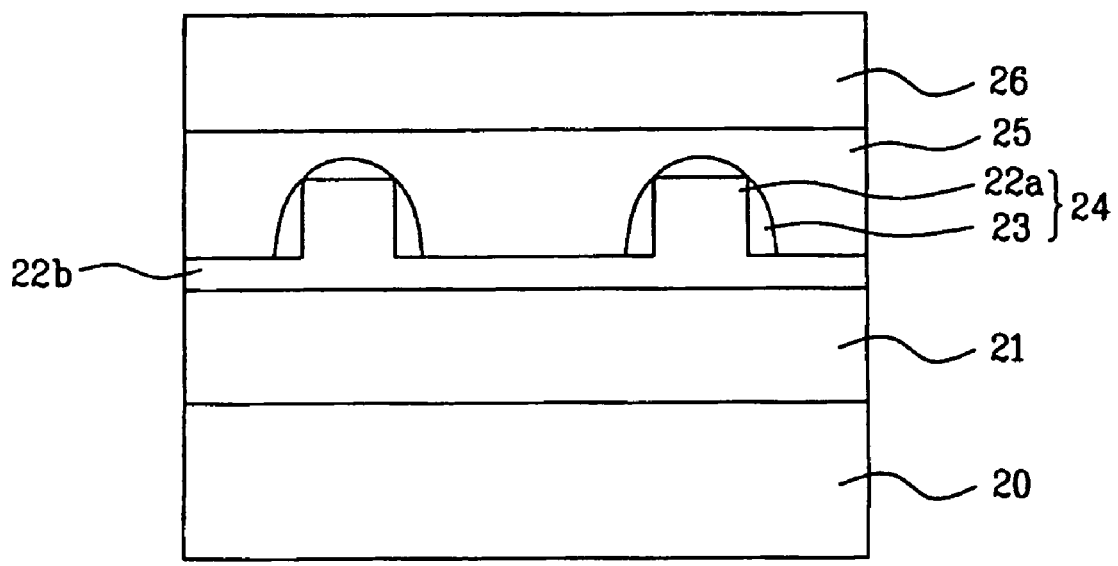
FIG. 3 illustrates a structure of a CMOS image sensor according to the present invention.

FIG. 3 illustrates a structure of a CMOS image sensor according to the present invention. Herein, a pad insulating layer 21 is formed on a sub-layer 20 having a photodiode and various transistors formed thereon. Then, a micro-lens 24 is formed on the pad insulating layer 21. The micro-lens 24 includes a first insulating layer 22 having an uneven surface, and a second insulating layer 23 formed in a dome shape by covering upper and side surfaces of projected portions of the uneven surface.

Herein, it is preferable that the first insulating layer 22 is formed of a nitride layer, and that the second insulating layer 23 is formed of an oxide layer. In addition, a planarization layer 25 is formed on the micro-lens 24, so as to form a uniform color filter. Then, a color filter 26 is formed on the planarization layer 25. The method for fabricating the CMOS image sensor having the above-described structure will now be described in detail.

Figure 4A:
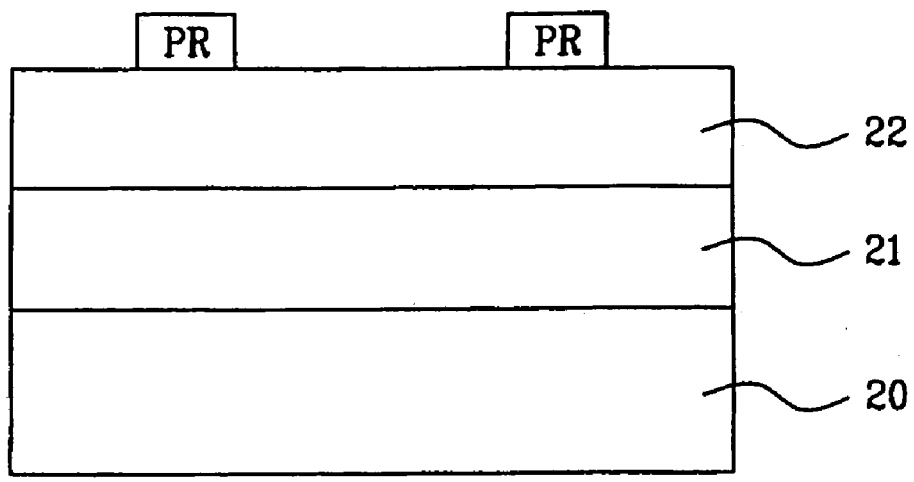
FIGS. 4A to 4F illustrate cross-sectional views of a method for fabricating the CMOS image sensor according to an embodiment of the present invention.

FIGS. 4A to 4F illustrate cross-sectional views of a method for fabricating the CMOS image sensor according to an embodiment of the present invention. Referring to FIG. 4A, a pad insulating layer 21 is formed on a sub-layer 20 having the photodiode and the transistors formed thereon, so as to form the unit pixel of the CMOS image sensor. Then, although not shown in the drawings, the pad insulating layer 21 is selectively removed, so as to expose a metal line within the sub-layer 20. The metal line is used for connecting the transistors to an external device.

Then, a first insulating layer 22 is formed on the pad insulating layer 21. Thereafter, photoresist (PR) is deposited on the first insulating layer 22, and the photoresist (PR) is treated with exposing and developing processes, thereby patterning the photoresist. At this point, it is preferable to use a silicon nitride (SiN) layer as the nitride layer of the first insulating layer 22.

Figure 4B:
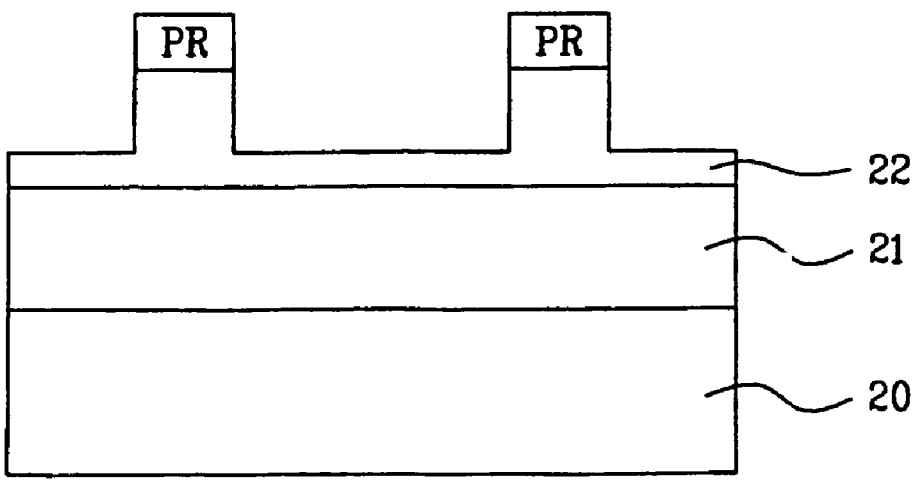

Subsequently, referring to FIG. 4B, the patterned photoresist (PR) is used as a mask to etch the first insulating layer 22. However, the first insulating layer 22 is not completely etched, and the etching process is controlled so as to leave a predetermined thickness of residue, thereby forming the first insulating layer 22 to have an uneven surface. At this point, since the first insulating layer 22 is not completely etched, the pad insulating layer and the metal line that are formed under the first insulating layer 22 are not exposed.

Figure 4C:
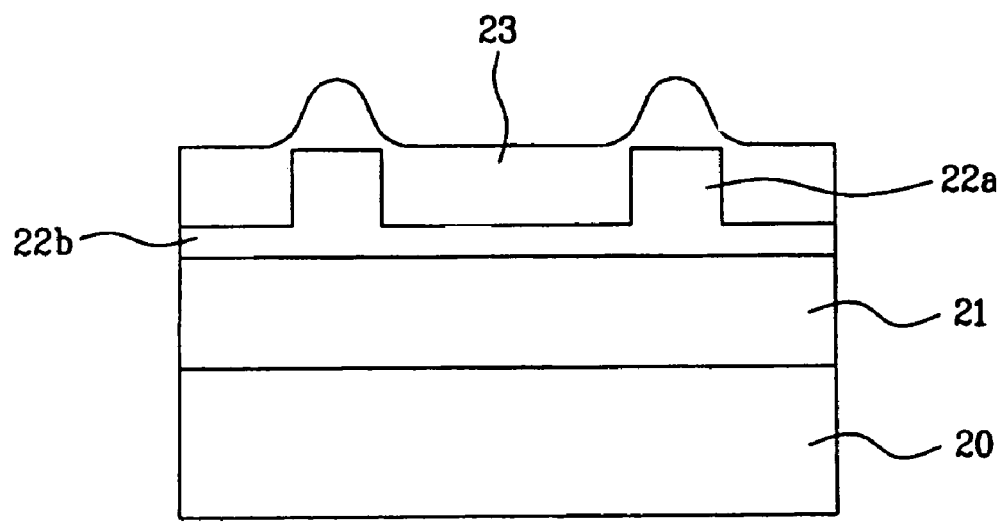

Then, after removing the photoresist (PR), as shown in FIG. 4C, a high deposition plasma (HDP) process is performed, thereby depositing a second insulating layer 23 having a different refractive ratio as the first insulating layer 22 is deposited on the surface of the structure. At this point, it is preferable to form the second insulating layer of an oxide layer. Due to the characteristics of the HDP process, deposition materials can be formed in a mountain shape on structures having small surfaces.

Figure 4D:
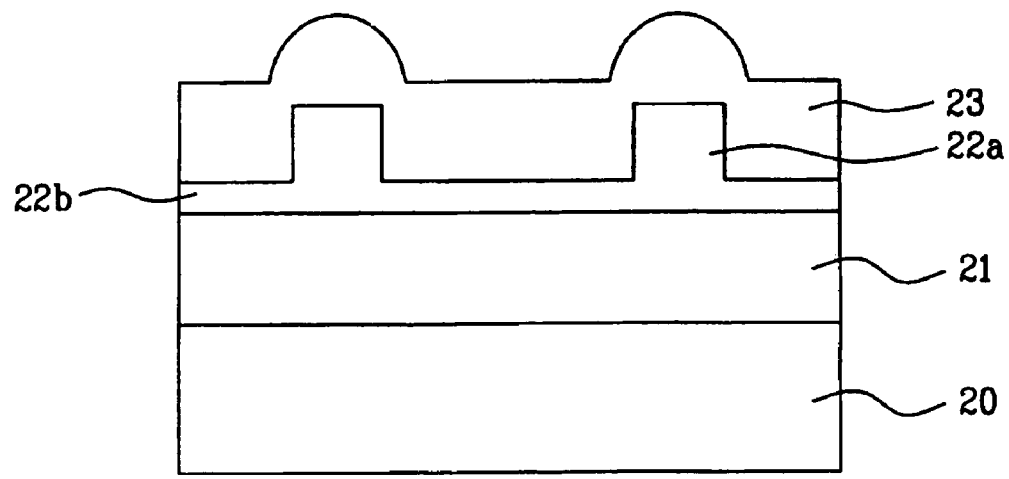

Thereafter, referring to FIG. 4D, the second insulating layer 23 is additionally deposited, thereby forming a flat surface on a trench portion of the first insulating layer 22 and a dome shape on the projected portion of the first insulating layer 22. If the second insulating layer 23 is formed of an oxide layer, an $O_3$ deposition process is performed for an additional deposition process.

Figure 4E:
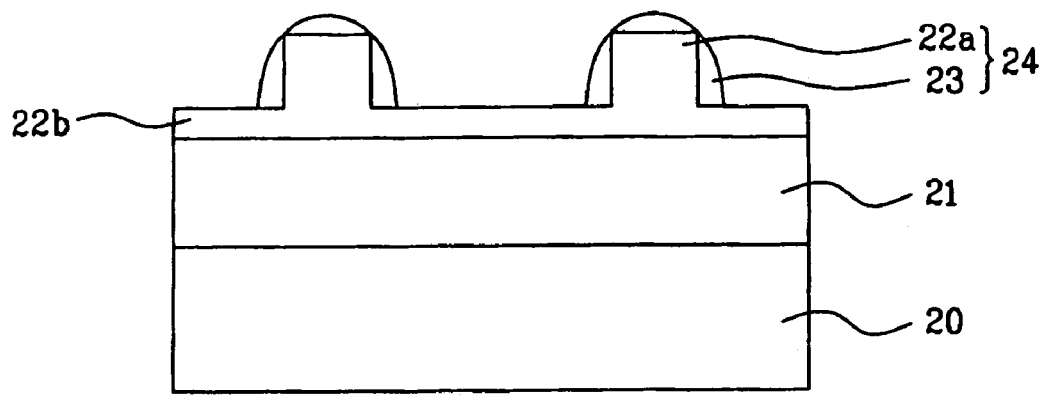

Subsequently, the second insulating layer 23 is etched by using an etch-back process. And, as shown in FIG. 4E, the second insulating layer 23 is formed on the projected portion of the first insulating layer 22, thereby forming a dome shape, which covers the upper and side surfaces of the projected portion of the first insulating layer 22. At this point, the etch-back process is performed in a compound gas environment including 20 to 200 sccm of argon (Ar), 5 to 20 sccm of $C_4F_8$, 30 to 50 sccm of $CH_5F$, and 20 to 50 sccm of $O_2$, at an upper bias of 300 W, lower bias of 50 to 150 W, a pressure of 100 to 200 mTorr. Thus, the micro-lens 24 including the first and second insulating layers 22 and 23 is formed.

Figure 4F:
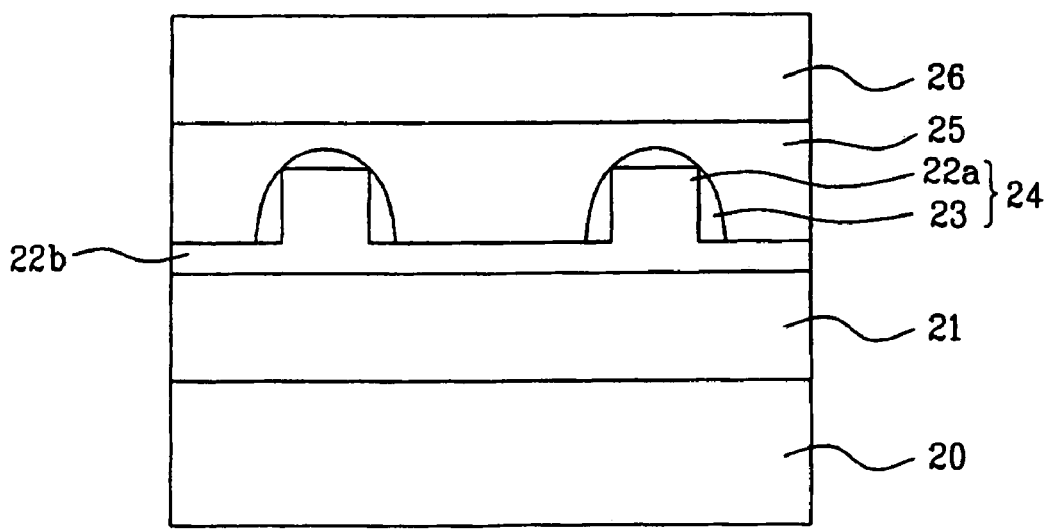

In addition, referring to FIG. 4F, a planarization layer 25 is formed on an entire surface including the micro-lens 24. Then, dyed photoresist is deposited on the planarization layer 25 and treated with light-exposing and developing processes, so as to form a color filter layer 26. Thus, the fabrication process of the CMOs image sensor is completed.

As described above, the CMOS image sensor and the method for fabricating the same have the following advantages. Since a micro-lens is formed by using an insulating layer instead of a photoresist, a curvature of the micro-lens can be adjusted and the micro-lens can be formed to have a smaller size, thereby enhancing the device integration.

Also, by forming the micro-lens below the color filter, the distance between the micro-lens and the photodiode can be reduced. Thus, a light passing though the micro-lens can be easily transmitted to the photodiode, thereby enhancing light focusing efficiency.

Finally, since the micro-lens is formed of a nitride layer and an oxide layer, which both have a different refractive ratio, a refractive angle of the light passing through the micro-lens can be increased. Thus, the light passing though the micro-lens can be easily transmitted to the photodiode, thereby enhancing light focusing efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A complementary metal-oxide semiconductor (CMOS) image sensor, comprising:
   a sub-layer having a photodiode and a plurality of transistors formed thereon;
   a pad insulating layer formed on the sub-layer;
   a micro-lens formed on the pad insulating layer, the micro-lens including a first insulating layer having a projected rectangular surface and a second insulating layer covering upper and side surfaces of the projected rectangular surface of the first insulating layer to form a dome shape;
   a planarization layer formed on the micro-lens; and
   a color filter formed on the planarization layer.

2. The image sensor of claim 1, wherein a refraction ratio of the first insulating layer is different from a refraction ratio of the second insulating layer.

3. The image sensor of claim 2, wherein the first insulating layer is formed of a nitride layer, and wherein the second insulating layer is formed of an oxide layer.

* * * * *